United States Patent
Liu et al.

(10) Patent No.: US 10,054,501 B2
(45) Date of Patent: Aug. 21, 2018

(54) IN-SITU STRESS DETECTOR FOR AN ELECTRODE AND A METHOD OF USE

(71) Applicant: NISSAN NORTH AMERICA, INC., Franklin, TN (US)

(72) Inventors: Ying Liu, Walled Lake, MI (US); Kenzo Oshihara, Novi, MI (US)

(73) Assignee: Nissan North America, Inc., Franklin, TN (US)

( * ) Notice: Subject to any disclaimer, the term of this patent is extended or adjusted under 35 U.S.C. 154(b) by 157 days.

(21) Appl. No.: 15/071,734

(22) Filed: Mar. 16, 2016

(65) Prior Publication Data
US 2017/0268940 A1 Sep. 21, 2017

(51) Int. Cl.
G01L 1/00 (2006.01)
G01L 1/16 (2006.01)
G01R 31/01 (2006.01)
H01M 10/42 (2006.01)

(52) U.S. Cl.
CPC ............ G01L 1/16 (2013.01); G01R 31/016 (2013.01); H01M 10/4285 (2013.01)

(58) Field of Classification Search
None
See application file for complete search history.

(56) References Cited

U.S. PATENT DOCUMENTS

| | | | | |
|---|---|---|---|---|
| 7,992,431 B2* | 8/2011 | Shih | .............. | B82Y 35/00 73/105 |
| 8,857,248 B2* | 10/2014 | Shih | .............. | B82Y 35/00 116/275 |
| 9,203,092 B2* | 12/2015 | Slocum | .............. | H01M 4/0478 |
| 9,410,873 B2* | 8/2016 | Wilson | .............. | B01L 3/502707 |
| 2010/0206696 A1* | 8/2010 | Kondoh | .............. | B01L 3/50273 198/630 |
| 2012/0137787 A1* | 6/2012 | Yao | .............. | G01L 1/16 73/767 |
| 2014/0166483 A1* | 6/2014 | Chow | .............. | B03C 5/005 204/451 |

FOREIGN PATENT DOCUMENTS

CN 103900744 A 7/2014

OTHER PUBLICATIONS

Sethuraman, Vijay A., et al., "In Situ Measurements of Stress Evolution in Silicon Thin Films During Electrochemical Lithiation and Delithiation", Journal of Power Sources, 195(15), 5062-5066 (2010).
Jones, E.M.C., et al., "In Situ Measurements of Strains in Composite Battery Electrodes during Electrochemical Cycling", Experimental Mechanics, 54:971-985 (2014).

* cited by examiner

*Primary Examiner* — Peter Macchiarolo
*Assistant Examiner* — Jermaine Jenkins
(74) *Attorney, Agent, or Firm* — Young Basile Hanlon & MacFarlane, P.C.

(57) ABSTRACT

A stress detector for detecting an in-situ stress profile of an electrode has a liquid cell, a holder configured to attach to one end of a sample electrode so that the sample electrode is cantilevered in the liquid cell, a piezo sensor comprising a piezo material in the liquid cell and having a movable end configured to contact the sample electrode and a fixed end fixedly engaged within the liquid cell and a measurement sensor in contact with the piezo sensor.

17 Claims, 3 Drawing Sheets

IN-SITU STRESS DETECTOR FOR AN ELECTRODE AND A METHOD OF USE

TECHNICAL FIELD

This disclosure relates to an in-situ stress detector for an electrode and the use of such detector, and in particular to an in-situ stress detector having a piezo material used to measure the stress of the electrode.

BACKGROUND

Conventional in-situ stress evolution measurements in battery electrodes tested during lithiation and delithiation use an optical sensor system, relying on high accuracy of the camera used. The systems are expensive and unstable.

SUMMARY

Disclosed herein is an in-situ stress detector for testing an electrode, along with a method of its use.

As disclosed herein, a stress detector for detecting an in-situ stress profile of an electrode has a liquid cell, a holder configured to attach to one end of a sample electrode so that the sample electrode is cantilevered in the liquid cell, a piezo sensor comprising a piezo material in the liquid cell and having a movable end configured to contact the sample electrode and a fixed end fixedly engaged within the liquid cell and a measurement sensor in contact with the piezo sensor.

A method for in-situ detection of a stress profile of an electrode is disclosed. The method comprises suspending an electrode in a liquid cell comprising a piezo sensor by attaching a fixed end of the electrode to the liquid cell and attaching a movable end of the electrode to a movable end of the piezo sensor. The piezo sensor is fixedly attached at an opposite end to the liquid cell. The liquid cell is cycled through charge and discharge. Movement of the movable end of the piezo sensor is measured with a measurement meter.

These and other aspects of the present disclosure are disclosed in the following detailed description of the embodiments, the appended claims and the accompanying figures.

BRIEF DESCRIPTION OF THE DRAWINGS

The invention is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 4A is the stress of surface stress and volume expansion, FIG. 4B is the stress of lithium ion diffusion, and FIG. 4C is the stress as a result of weight changes.

DETAILED DESCRIPTION

The stress detector for detecting an in-situ stress profile of an electrode as disclosed herein eliminates the instability, inaccuracy and high costs of the conventional stress detection systems using optical sensors. In these conventional systems, as a non-limiting example, a cantilevered electrode is suspended in a liquid cell. A white light interferometer combined with a potentiostat is used. The white light is directed to the electrode during cycling. A CCD camera records changes in the light due to movement of the electrode. Any slight movement of any part of the system will throw off the measurements. Reproducibility is low as it is difficult to set up the electrode and the light source in exactly the same manner as previous tests. The system is also expensive.

Figure 1:
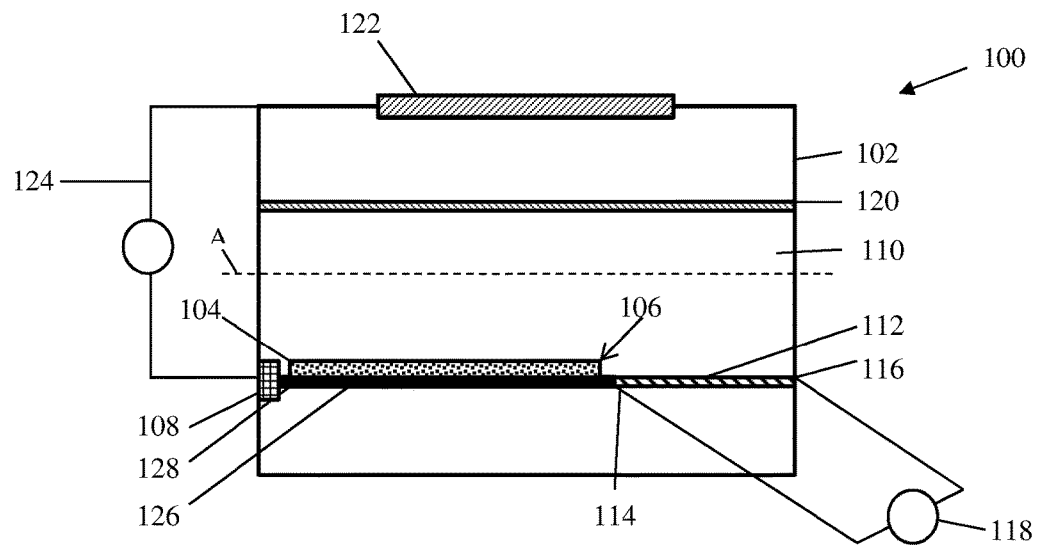
FIG. 1 is a cross-sectional view of a stress detector for detecting an in-situ stress profile of an electrode as disclosed herein.

FIG. 1 is a cross sectional view of a stress detector 100 for detecting an in-situ stress profile of an electrode, with a sample electrode installed for testing. A liquid cell 102 is configured to attach to a fixed end 104 of a sample electrode 106 via a holder 108 so that the sample electrode 106 is cantilevered in the liquid cell 102. The liquid cell 102 contains a liquid electrolyte 110. A piezo sensor 112 comprising a piezo material is suspended in the liquid cell 102 and has a movable end 114 configured to contact the sample electrode 106 and a fixed end 116 fixedly engaged within the liquid cell 102. A measurement sensor 118 is in contact with the piezo sensor 112.

The liquid cell 102 has a separator 120 spaced from and above the sample electrode 106 and a lithium metal 122 spaced from and above the separator 120. Current is generated through the circuit 124 between the lithium metal 122 and the current collector 126 to mimic the actual operation of a lithium ion battery cell.

The holder 108 can be configured to contact the sample electrode 106 by an end 128 of the current collector 126 where no active material 130 is layered. The holder 108 can be attached to a wall of the liquid cell 102. The holder 108 must be conductive to conduct current through the circuit 124. Copper is a non-limiting example of an appropriate material for the holder 108. Alternatively, the end 128 of the current collector 126 can be attached directly to the circuit 124.

Figure 2:
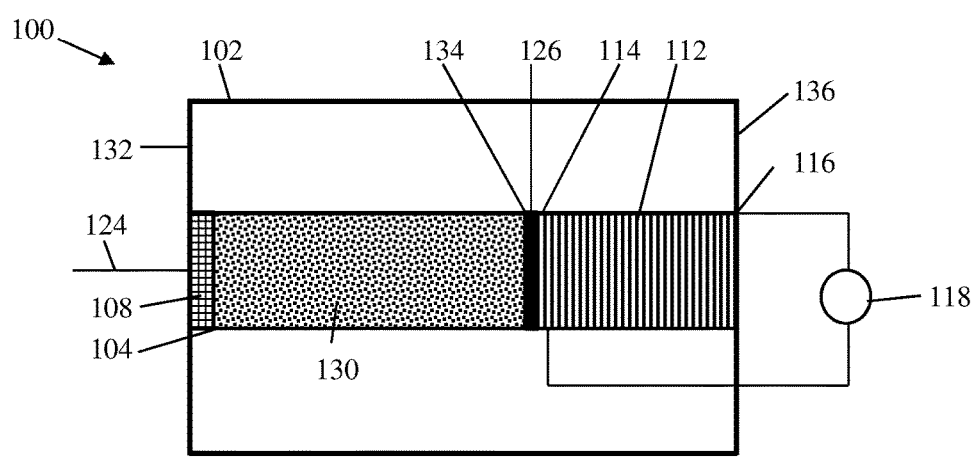
FIG. 2 is a plan view of the stress detector of FIG. 1 along line A.

FIG. 2 is a plan view of the stress detector 100 cut along line 2 of FIG. 1. The fixed end 104 of the sample electrode 106 is attached to the holder 108 of the liquid cell 102 on a first wall 132. The sample electrode 106 also has a movable end 134 such that the sample electrode 106 is cantilevered in the electrolyte 110 of the liquid cell 102. The movable end 134 of the sample electrode 106 is contacted with the movable end 114 of the piezo sensor 112. The movable ends 134, 114 of the sample electrode 106 and the piezo sensor 112 can be attached so that the movable end 114 of the piezo sensor 112 moves with the movable end 134 of the sample electrode 106. The movable end 114 of the piezo sensor 112 may only contact the current collector 126 at the movable end 134 of the sample electrode 106. The fixed end 116 of the piezo sensor 112 is fixed to a second wall 136 of the liquid cell 102 opposite the first wall 132.

The piezo sensor 112 is non-conductive so that a short circuit is not formed within the liquid cell 102. The piezo sensor 112 can be a piezo thin film, being very light, so that the contact with the movable end 134 of the sample electrode 106 does not influence the movement of the sample electrode 106. As a non-limiting example, the piezo sensor or thin film can be a polyvinylidene fluoride material. Other appropriate piezo materials known to those skilled in the art are contemplated.

The measurement sensor 118 is configured to measure a movement of the piezo sensor 112. The measurement sensor 118 is in contact with the movable end 114 of the piezo sensor 112. A non-limiting example of the measurement sensor 118 is a voltmeter configured to measure a voltage generated from a change in shape of the piezo sensor 112.

Figure 3:
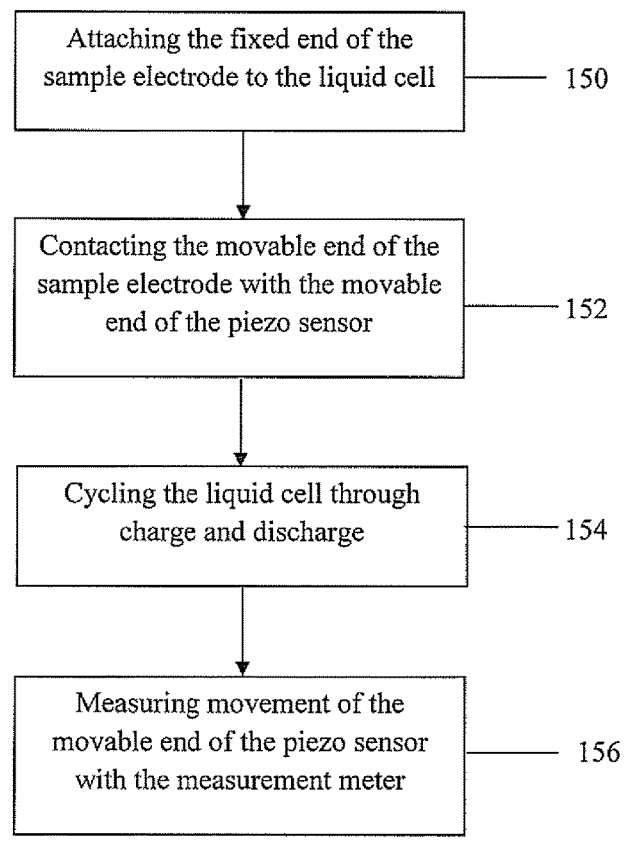
FIG. 3 is a flow diagram of a method of using the stress detector of FIG. 1.

A method for in-situ detection of a stress profile of an electrode is shown in the flow diagram of FIG. 3. The method comprises suspending the sample electrode 106 in the liquid cell 102 having the piezo sensor 112 by attaching the fixed end 104 of the sample electrode 106 to the liquid cell 102 using the holder 108 or other means in step 150, and contacting the movable end 134 of the sample electrode 106 with the movable end 114 of the piezo sensor 112 in step 152. The liquid cell 102 is cycled through charge and discharge during the test in step 154. Movement of the movable end 114 of the piezo sensor 112 is measured with the measurement meter 118 in step 156.

Figure 4A:
FIGS. 4A-4C are diagrams illustrating the concept of in-situ stress diagnosis of electrodes by the stress detector of FIG. 1.
Figure 4B:
Figure 4C:
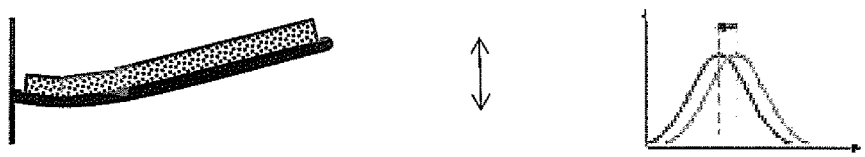

During cycling of the liquid cell 102, lithiation and delithiation occurs, stressing the active material in the active material layer 130 of the sample electrode 106. Non-limiting examples of the stresses that can occur to the active material are shown in FIGS. 4A-4C. In FIG. 4A, surface stress and volume expansion during lithiation is illustrated, swelling the active material layer 130 of the sample electrode 106, showing mean stress. In FIG. 4B, lithium ion diffusion is illustrated in the active material layer 130 of the sample electrode 106, showing gradient stress. In FIG. 4C, vibration and resonance are illustrated, bending and moving the sample electrode 106 relative to its fixed end 104. A frequency shift is shown.

The ability to monitor and test stress on electrodes is important, and becomes more so as materials such as silicon, tin and germanium are used in the active material layer. These materials expand by nearly 300% during lithiation due to their high lithium capacities.

The piezo sensor 112 will sense pressure against it due to surface stress and volume expansion, will sense gradient stress due to lithium ion diffusion, will sense any movement in the movable end 134 of the sample electrode 106, and will detect any other movement caused during the testing. The measurement meter 118 measures the electric charge that accumulates in the piezo sensor 112 in response to the applied mechanical stress by the sample electrode 106.

Figures 5A, 5B:
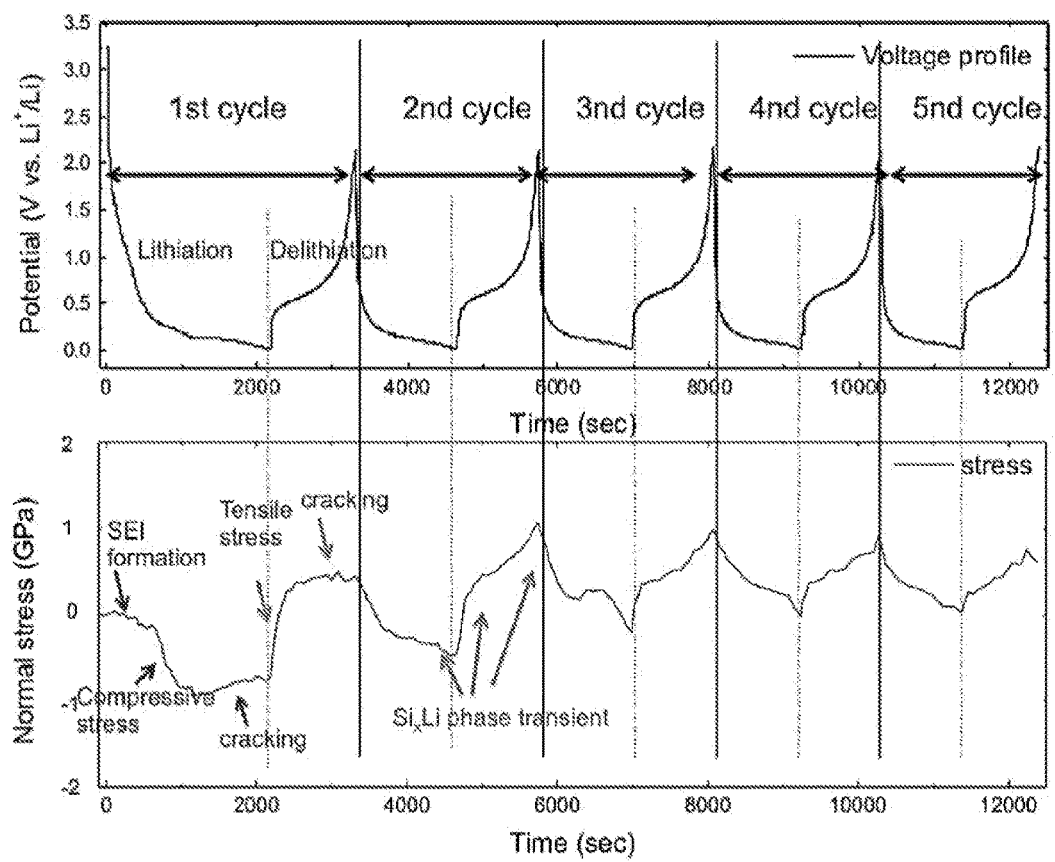
FIG. 5A is an In-situ stress evolution measurement during charging and discharging by using silicon anode for the first 5 cycles, showing voltage of silicon anode vs. time.
FIG. 5B is an In-situ stress evolution measurement during charging and discharging by using silicon anode for the first 5 cycles, showing stress detected by piezo sensor vs. time.

FIG. 5A is a voltage profile generated by a piezo sensor 112 during a stress test with the stress detector 100 disclosed herein. FIG. 5A illustrates the potential of the silicon electrode 118 over five cycles of lithiation and delithiation. FIG. 5B is a profile showing the corresponding stress evolution of the silicon electrode during lithiation and delithiation over the same five cycles.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A or B, X can include A alone, X can include B alone or X can include both A and B. In addition, the articles "a" and "an" as used in this application and the appended claims should generally be construed to mean "one or more" unless specified otherwise or clear from context to be directed to a singular form.

The above-described embodiments, implementations and aspects have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

Other embodiments or implementations may be within the scope of the following claims.

What is claimed is:

1. A stress detector for detecting an in-situ stress profile of an electrode of a battery comprising a current collector having a surface on which electrode active material is applied, the stress detector comprising:
   a liquid cell;
   a holder configured to attach to one end of the current collector so that the electrode is cantilevered in the liquid cell;
   a piezo sensor comprising a piezo material in the liquid cell and having a movable end configured to contact the current collector at an end opposite the holder and a fixed end fixedly engaged within the liquid cell on a wall opposite the holder; and
   a measurement sensor in contact with the piezo sensor.

2. The stress detector of claim 1, wherein the measurement sensor is a voltmeter configured to measure a voltage generated from a change in shape of the piezo sensor.

3. The stress detector of claim 1, wherein the piezo sensor is non-conductive.

4. The stress detector of claim 1, wherein the piezo sensor is a piezo thin film.

5. The stress detector of claim 4, wherein the piezo thin film is a polyvinylidene fluoride material.

6. The stress detector of claim 1, wherein the measurement sensor is in contact with the movable end of the piezo sensor.

7. The stress detector of claim 1, wherein the measurement sensor is configured to measure a movement of the piezo sensor.

8. A stress detector for detecting an in-situ stress profile of an electrode in a liquid cell representing a lithium ion battery, the stress detector comprising:
   the electrode comprising a current collector having a surface on which electrode active material is applied, opposing ends of the current collector remaining uncovered;
   a holder configured to attach to one end of the current collector so that the electrode is cantilevered in the liquid cell;
   a piezo sensor comprising a piezo material in the liquid cell and having a movable end configured to contact the current collector at an end opposite the holder and a fixed end fixedly engaged within the liquid cell;
   a measurement sensor in contact with the piezo sensor;

a separator spaced from the electrode active material opposite the current collector;

lithium metal spaced from the separator opposite the electrode active material; and electrolyte filling the liquid cell.

9. A method for in-situ detection of a stress profile of an electrode, the method comprising:

suspending the electrode in a liquid cell comprising a piezo sensor, the electrode comprising a current collector having a surface on which electrode active material is applied, opposing ends of the current collector remaining uncovered, by:

attaching a fixed end of the current collector to the liquid cell; and contacting a movable end of the current collector opposite the fixed end with a movable end of the piezo sensor, wherein the piezo sensor is fixedly attached at an opposite end to the liquid cell;

cycling the liquid cell through charge and discharge;

measuring a movement of the movable end of the piezo sensor with a measurement meter.

10. The method of claim 9, wherein the measurement sensor is a voltmeter that measures a voltage generated from a change in shape of the piezo sensor.

11. The method of claim 9, wherein the piezo sensor is non-conductive.

12. The method of claim 9, wherein the piezo sensor is a piezo thin film.

13. The method of claim 12, wherein the piezo thin film is a polyvinylidene fluoride material.

14. The method of claim 9, wherein the liquid cell represents a lithium ion battery, the liquid cell comprising:

a separator spaced from the electrode active material opposite the current collector;

lithium metal spaced from the separator opposite the electrode active material; and electrolyte filling the liquid cell.

15. The method of claim 9, wherein the measurement sensor is in contact with the movable end of the piezo sensor.

16. The method of claim 9, wherein the fixed end of the piezo sensor is attached to a wall of the liquid cell.

17. The method of claim 16, wherein the fixed end of the current collector is attached to a wall of the liquid cell opposite the fixed end of the piezo sensor.

* * * * *